(12) United States Patent
Tian et al.

(10) Patent No.: US 9,780,120 B2
(45) Date of Patent: Oct. 3, 2017

(54) METHOD FOR MANUFACTURING ARRAY SUBSTRATE, ARRAY SUBSTRATE THEREOF AND DISPLAY DEVICE

(71) Applicant: BOE TECHNOLOGY GROUP CO., LTD., Beijing (CN)

(72) Inventors: Xiaoxiong Tian, Beijing (CN); Zhuo Zhang, Beijing (CN); Wei Deng, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/416,032

(22) PCT Filed: May 30, 2014

(86) PCT No.: PCT/CN2014/078921
§ 371 (c)(1),
(2) Date: Jan. 20, 2015

(87) PCT Pub. No.: WO2015/096395
PCT Pub. Date: Jul. 2, 2015

(65) Prior Publication Data
US 2016/0141306 A1      May 19, 2016

(30) Foreign Application Priority Data

Dec. 25, 2013   (CN) .......................... 2013 1 0727100

(51) Int. Cl.
*H01L 27/14*     (2006.01)
*H01L 21/00*     (2006.01)
(Continued)

(52) U.S. Cl.
CPC .......... *H01L 27/124* (2013.01); *H01L 27/127* (2013.01); *H01L 27/1288* (2013.01)

(58) Field of Classification Search
CPC .. H01L 27/124; H01L 27/127; H01L 27/1288
(Continued)

(56) References Cited

U.S. PATENT DOCUMENTS

| 2005/0077516 | A1* | 4/2005 | Lim | G02F 1/13458 257/59 |
| 2005/0095759 | A1* | 5/2005 | Cho | H01L 27/1288 438/158 |

(Continued)

FOREIGN PATENT DOCUMENTS

| CN | 1743930 A | 3/2006 |
| CN | 101170085 A | 4/2008 |

(Continued)

OTHER PUBLICATIONS

Machine translation China Patent Publication CN102723269A.*
(Continued)

*Primary Examiner* — Dzung Tran
(74) *Attorney, Agent, or Firm* — Brooks Kushman P.C.

(57) ABSTRACT

The present disclosure provides a method for manufacturing an array substrate, an array substrate and a display device. The method includes: forming a gate line, a gate electrode and an insulating layer which covers the gate line and the gate electrode on a first surface of a substrate; forming a semiconductive film on the insulating layer; patterning the semiconductive film using the gate electrode and the gate line as a mask, so as to form an source semiconductive layer at a region where the gate line and the gate electrode are located; and manufacturing a target semiconductive layer using the source semiconductive layer.

15 Claims, 4 Drawing Sheets

(51) Int. Cl.
*H01L 21/338* (2006.01)
*H01L 27/12* (2006.01)

(58) Field of Classification Search
USPC ....... 257/43, 72, 59, E23.001; 438/104, 149, 438/158, 29
See application file for complete search history.

(56) References Cited

U.S. PATENT DOCUMENTS

| | | | |
|---|---|---|---|
| 2006/0145161 A1* | 7/2006 | Lee | G02F 1/13458 257/72 |
| 2008/0035971 A1* | 2/2008 | Hong | G02F 1/13458 257/296 |
| 2008/0169470 A1* | 7/2008 | Lim | H01L 27/1214 257/59 |
| 2009/0170037 A1* | 7/2009 | Choung | G03F 7/425 430/318 |
| 2012/0241736 A1 | 9/2012 | Imoto et al. | |

FOREIGN PATENT DOCUMENTS

| | | |
|---|---|---|
| CN | 101211930 A | 7/2008 |
| CN | 102405517 A | 4/2012 |
| CN | 102723269 A | 10/2012 |
| CN | 102820319 A | 12/2012 |
| CN | 103700626 A | 4/2014 |

OTHER PUBLICATIONS

Office Action in Chinese Patent Application No. 201310727100.X, dated Sep. 28, 2015.
International Search Report and Written Opinion in PCT International Application No. PCT/CN2014/078921, dated Sep. 22, 2014.

\* cited by examiner

METHOD FOR MANUFACTURING ARRAY SUBSTRATE, ARRAY SUBSTRATE THEREOF AND DISPLAY DEVICE

CROSS-REFERENCE TO RELATED APPLICATION

This application is the U.S. national phase of PCT Application No. PCT/CN2014/078921 filed on May 30, 2014, which claims a priority of the Chinese patent application No. 201310727100.X filed on Dec. 25, 2013, which is incorporated herein by reference in its entirety.

TECHNICAL FIELD

The present disclosure relates to the field of liquid crystal, in particular to a method for manufacturing an array substrate, an array substrate, and a display device.

BACKGROUND

An array substrate is one of major components of a thin film transistor liquid crystal display (TFT LCD). When manufacturing the array substrate of the TFT, a gate line, a gate electrode, and a gate insulating layer which covers the gate line and the gate electrode are formed, and then an active layer is formed on the gate insulating layer.

When forming the active layer, a semiconductive film for manufacturing the active layer needs to be coated on the gate insulating layer, then the semiconductive film is coated with a photoresist, which is irradiated from the right side through a mask, and then the active layer is formed by processes such as etching and developing.

However, in the above technical solution, a problem that the mask cannot be exactly aligned unavoidably exists, which results in misalignment of the resultant active layer. Furthermore, due to the misalignment of the active layer, a part of the light from a backlight source will be irradiated onto the active layer to generate a leakage current, which finally leads to inhomogeneous luminance of a display manufactured using the array substrate.

SUMMARY

The present disclosure aims to provide a method for manufacturing an array substrate, an array substrate, and a display device, so as to avoid misalignment of an active layer, thereby to avoid inhomogeneous luminance of a display resulted from the misalignment of the active layer.

In one aspect, the present disclosure provides a method for manufacturing an array substrate, including the steps of:

forming a gate line, a gate electrode and a gate insulating layer which covers the gate line and the gate electrode on a first surface of a substrate;

forming a semiconductive film on the gate insulating layer;

patterning the semiconductive film using the gate electrode and the gate line as a mask, so as to form a source semiconductive layer at a region where the gate line and the gate electrode are located;

manufacturing a target semiconductive layer using the source semiconductive layer.

The step of patterning the semiconductive film using the gate electrode and the gate line as the mask, so as to form the source semiconductive layer at the region where the gate line and the gate electrode are located specifically includes:

forming a positive photoresist film on the substrate provided with the semiconductive film;

exposing the positive photoresist film from a second surface opposite to the first surface of the substrate;

developing the exposed positive photoresist film, and removing the exposed positive photoresist film outside the region where the gate line and the gate electrode are located, so as to expose the semiconductive film outside the region where the gate line and the gate electrode are located; and removing the exposed semiconductive film outside the region where the gate line and the gate electrode are located, so as to obtain the source semiconductive layer.

The step of manufacturing the target semiconductive layer using the source semiconductive layer is completed by a single patterning process prior to forming a source/drain electrode film.

The step of manufacturing the target semiconductive layer using the source semiconductive layer specifically includes:

forming a positive photoresist film on the source semiconductive layer;

exposing the positive photoresist film;

developing the exposed positive photoresist film, and removing the exposed positive photoresist film outside a predetermined region where a thin film transistor and a data line are to be formed, so as to expose the source semiconductive layer outside the predetermined region where the thin film transistor and the data line are to be formed; and removing the exposed source semiconductive layer outside the predetermined region where the thin film transistor and the data line are to be formed, so as to obtain the target semiconductive layer.

The step of manufacturing the target semiconductive layer using the source semiconductive layer is completed at the same time with a step of manufacturing a data line and a source/drain electrode of the thin film transistor.

The steps of manufacturing the target semiconductive layer and manufacturing the source/drain electrode of the thin film transistor are completed by a single patterning process through a half masking process.

The step of manufacturing the target semiconductive layer using the source semiconductive layer specifically includes:

forming the source/drain electrode film on the source semiconductive layer;

removing the source/drain electrode film outside a predetermined region where the thin film transistor and the data line are to be formed, and removing the source semiconductive layer outside the predetermined region where the thin film transistor and the data line are to be formed; and etching the source/drain electrode film reserved at the predetermined region where the thin film transistor is to be formed, so as to form a source electrode and a drain electrode.

The gate insulating layer is formed by a chemical vapor deposition method, and the semiconductive film is formed on the gate insulating layer by a chemical deposition method.

In another aspect, the present disclosure further provides an array substrate manufactured by the above-mentioned.

In yet another aspect, the present disclosure further provides a display device, which includes the above-mentioned array substrate.

According to the present disclosure, the gate electrode and the gate line are used as the mask to pattern the semiconductive film which is used for manufacturing the active layer. The source semiconductive layer at the region where the gate line and the gate electrode are located is formed at first. The source semiconductive layer is obtained by exposing the photoresist film from the second surface opposite to the first surface provided with the gate electrode, and the resultant source semiconductive layer is located at the region where the gate line and the gate electrode are located, so the target semiconductive layer manufactured using such source semiconductive layer will certainly be located at the region where the gate line and the gate electrode are located. In this way, it is able to avoid the misalignment of the active layer, thereby to avoid the inhomogeneous luminance of the display resulted from the misalignment of the active layer.

DETAILED DESCRIPTION

To make the objects, the technical solutions and the advantages of the present disclosure more apparent, the present disclosure will be described hereinafter in conjunction with the drawings and embodiments.

Figure 1:
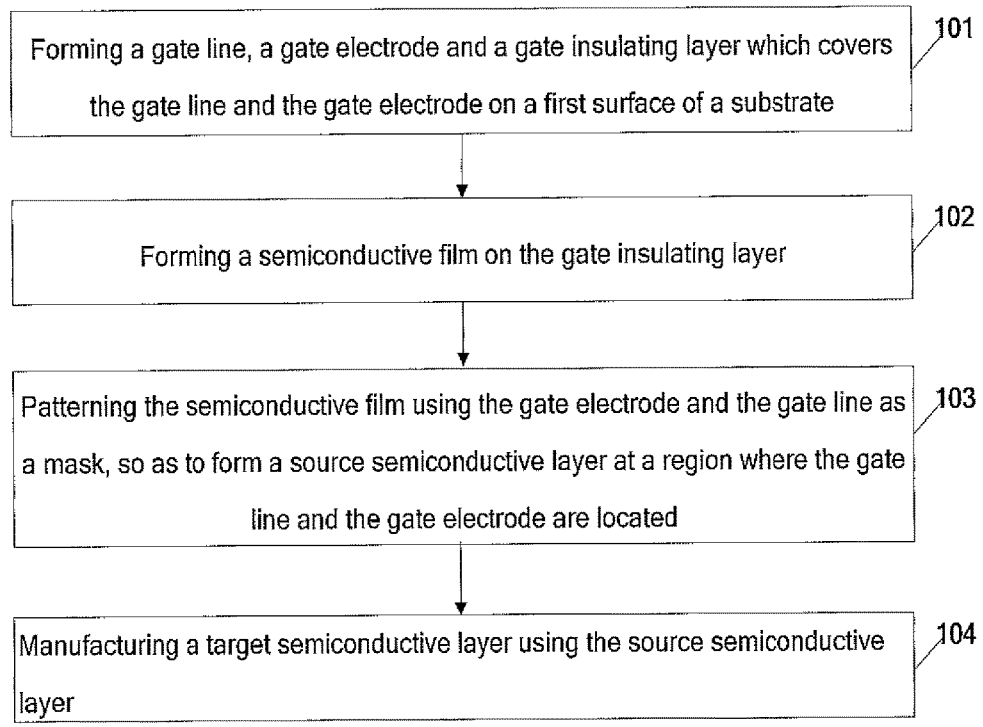
FIG. 1 is a flow chart of a method for manufacturing an array substrate according to one embodiment of the present disclosure.

The present disclosure provides a method for manufacturing an array substrate, as shown in FIG. 1, which includes:

Step 101: forming a gate line, a gate electrode and a gate insulating layer which covers the gate line and the gate electrode on a first surface of a substrate;

Step 102: forming a semiconductive film on the gate insulating layer;

Step 103: patterning the semiconductive film using the gate electrode and the gate line as a mask, so as to form a source semiconductive layer at a region where the gate line and the gate electrode are located; and Step 104: manufacturing a target semiconductive layer using the source semiconductive layer.

According to methods in the prior art, after the semiconductive film is formed in Step 102, a photoresist, after being coated, is exposed from the right side through a mask, and then an active layer is manufactured by processes such as developing and etching. However, in the above technical solution, a problem that the mask cannot be exactly aligned will unavoidably exist, which finally results in misalignment of the resultant active layer.

Only when the active layer is located at a region where the gate electrode and the gate line are located would an opaque feature of the gate electrode and the gate line be used to block the backlight from being irradiated onto the active layer. However, in a preferred embodiment of the present disclosure, the opaque feature of the gate line and the gate electrode is directly utilized during the manufacturing process, i.e., the gate line and the gate electrode are used as an opaque portion of a mask to block the light, so that the source semiconductive layer finally obtained after the development and etching is located at the region where the gate line and the gate electrode are located. Thus, the target semiconductive layer manufactured using such source semiconductive layer will certainly be located at the region where the gate line and the gate electrode are located.

When the manufactured target semiconductive layer is located at the region where the gate line and the gate electrode are located, there will inevitably exist the following advantageous effects. It is able to avoid the misalignment of the active layer caused when the mask cannot be exactly aligned during the manufacturing of the active layer. In addition, it is able to directly use the gate line and the gate electrode as the opaque portion of the mask by means of the opaque feature of the gate electrode and the gate line, thereby to reduce the cost desired for a mask process during the manufacturing of the array substrate. Further, it is able to avoid a leakage current generated when a part of the light from a backlight source is irradiated on the active layer due to the misalignment of the active layer, thereby to avoid the inhomogeneous luminance of the display manufactured using the array substrate.

According to the above method for manufacturing the array substrate, the gate line and the gate electrode may be formed in Step 101 by any known, single patterning process. For example, a gate electrode metal film may be patterned by means of a conventional mask, so as to form a pattern including the gate electrode and the gate line. To be specific, Step 101 may include: forming the gate metal film on the substrate; and exposing, developing and etching the gate metal film through a conventional mask so as to obtain the pattern including the gate electrode and the gate line.

Besides, prior to coating the semiconductive film for manufacturing the active layer, the gate insulating layer covering the gate line and the gate electrode needs to be further formed. The gate insulating layer may be formed by a chemical vapor deposition method, or any other processes known to those skilled in the art, which are not particularly defined herein.

Then, in Step 102, the semiconductive film is formed on the gate insulating layer by a chemical vapor deposition method, or any other methods known to those skilled in the art.

In a preferred embodiment of the present disclosure, the source semiconductive layer is formed at a region where the gate line and the gate electrode are located in Step 103, and the above source semiconductive layer may be formed by the following steps:

forming a positive photoresist film on the substrate provided with the semiconductive film;

exposing the positive photoresist film from a second surface opposite to the first surface of the substrate;

developing the exposed positive photoresist film, and removing the exposed positive photoresist film outside the region where the gate line and the gate electrode are located, so as to expose the semiconductive film outside the region where the gate line and the gate electrode are located; and removing the exposed semiconductive film outside the region where the gate line and the gate electrode are located, so as to obtain the source semiconductive layer.

In this embodiment of the present disclosure, the photoresist film is exposed from the second surface opposite to the first surface of the substrate by means of the opaque features of the positive photoresist and the gate electrode/line. Thus, after the development, the exposed positive photoresist outside the region where the gate line 11 and the gate electrode 1 are located can be removed, so as to expose the semiconductive film outside the region where the gate line and the gate electrode are located. Finally, after the semiconductive film outside the region where the gate line and the gate electrode are located is removed, so as to obtain the source semiconductive layer formed at the region where the gate line and the gate electrode are located.

Figure 2:
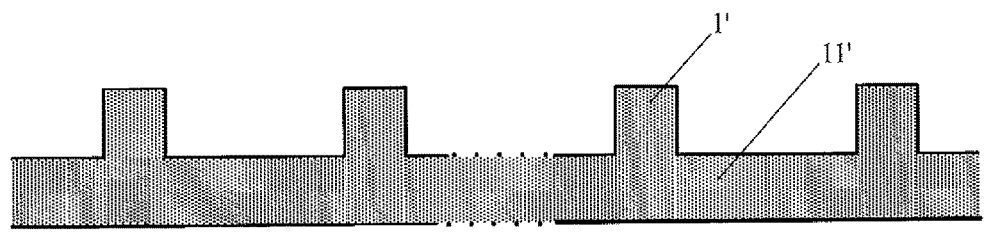
FIG. 2 is a schematic view showing a source semiconductive film according to one embodiment of the present disclosure.

FIG. 2 shows the resultant source semiconductive film. It can be seen that, when the semiconductive film is patterned using the gate electrode and the gate line as the mask, the resultant source semiconductive film has an identical shape to those of the gate electrode 1 and the gate line 11. Signs 1' and 11' represent portions corresponding to the gate electrode 1 and the gate line 11 on the source semiconductive film, respectively.

In Step 103 of forming the source semiconductive layer, the exposure is performed from the second surface opposite to the first surface of the substrate, i.e., the gate electrode is used as the mask to manufacture the source semiconductive layer, thus the formed source semiconductive layer is located at the region where the gate line and the gate electrode are located.

Figure 3:
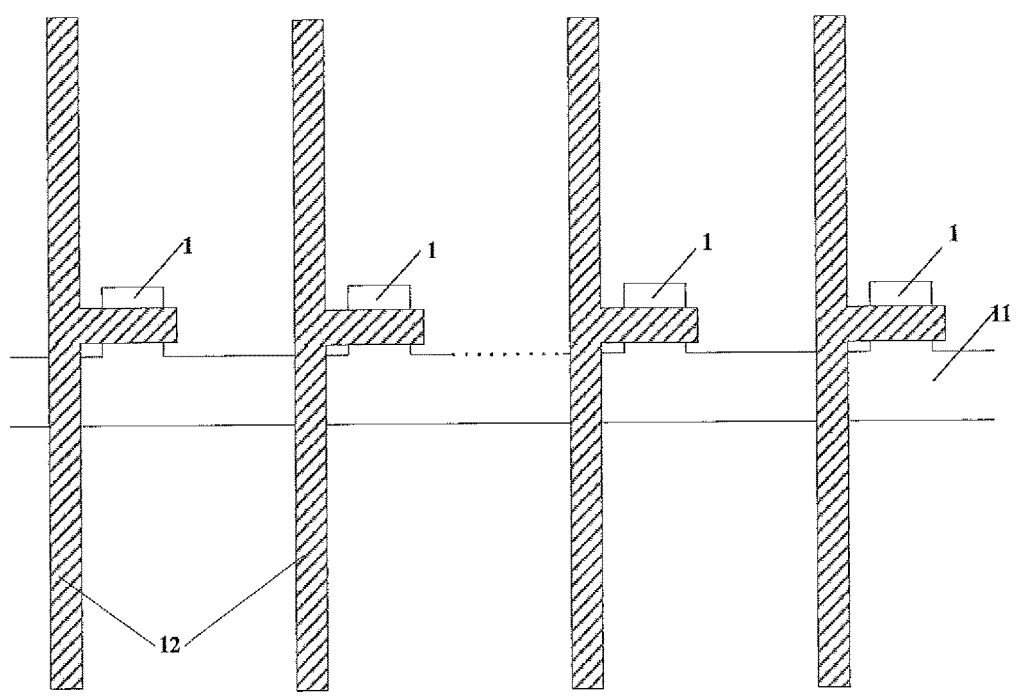
FIG. 3 is a schematic view showing the arrangement of a data line on the source semiconductive film according to one embodiment of the present disclosure.

It should be noted that, after the source semiconductive layer is formed, the resultant source semiconductive layer is continuous, and as shown in FIG. 3, when a high level is applied to the gate line 111, the source semiconductive layer above the gate line will be electrically connected, and all the data lines 12 will be short-circuited.

Figure 4:
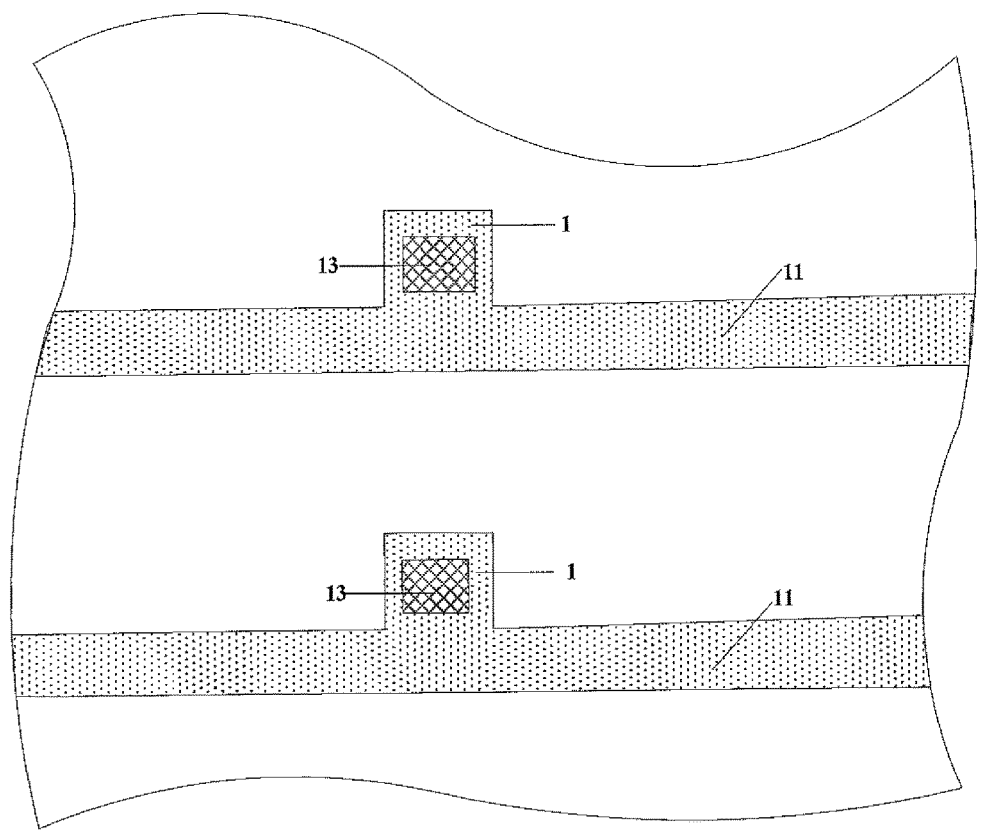
FIG. 4 is a schematic view showing the formation of a target semiconductive film according to one embodiment of the present disclosure.

Thus, after the above source semiconductive layer is formed, it needs to be further "modified" in Step 104, so as to obtain the target semiconductive layer 13 as shown in FIG. 4 (FIG. 4 is for illustrative purposes only, and the present disclosure is not limited to the shape of the target semiconductive layer shown in FIG. 4).

In summary, in the present disclosure, it is also required to manufacture the target semiconductive layer based on the source semiconductive layer, so that the target semiconductive layer only covers the predetermined region where the thin film transistor is to be formed. There are various modes for forming the target semiconductive layer, and merely two of them are provided hereinafter.

Mode 1

In this mode, Step 104 of manufacturing the target semiconductive layer using the source semiconductive layer is completed by a single patterning process prior to forming a source/drain electrode film.

Alternatively, Step 104 includes:

forming a positive photoresist film on the source semiconductive layer;

exposing the positive photoresist film;

developing the exposed positive photoresist film, and removing the exposed positive photoresist film outside a predetermined region where thin film transistor and a data line are to be formed, so as to expose the source semiconductive layer outside the predetermined region where the thin film transistor and the data line are to be formed; and removing the exposed source semiconductive layer outside the predetermined region where the thin film transistor and the data line are to be formed, so as to obtain the target semiconductive layer.

After the positive photoresist film is coated on the source semiconductive film and then developed, the exposed positive photoresist outside the predetermined region where the thin film transistor 13 and the data line 12 are to be formed is removed, so as to expose the source semiconductive layer outside the predetermined region where the thin film transistor 13 and the data line 12 are to be formed. As shown in FIG. 4, the source semiconductive layer corresponding to a position marked with dots is removed, so as to obtain the target semiconductive layer.

After the target semiconductive layer is obtained, a source/drain electrode (S/D), an insulating layer, a pixel electrode via hole and a pixel electrode may be successively formed on the target semiconductive layer, so as to obtain the entire array substrate. When the S/D layer is etched to form a channel between the source electrode and the drain electrode, if the semiconductive film for manufacturing the active layer consists of an intrinsic semiconductive film and a doped semiconductive film, it is further required to etch off the doped semiconductive layer within a channel region. The procedures for manufacturing the source/drain electrode, the insulating layer, the pixel electrode via hole, and the pixel electrode are the same as those in the prior art.

In the method of the present disclosure, the target semiconductive film is formed by a single patterning process in accordance with the source semiconductive layer at the region where the gate line and the gate electrode are located, so as to only cover the predetermined region where the thin film transistor is to be formed, thereby to avoid the abnormal display of the resultant display.

However, when the array substrate is manufactured through the above-mentioned mode, it is required to perform a separate masking process (corresponding to the step of forming the target semiconductive layer) on the active layer, resulting in an increase in the cost of the masking process. In order to reduce the cost of the masking process, the present disclosure provides the following mode where the step of forming the target semiconductive layer in accordance with the source semiconductive layer is combined with the subsequent step of forming the source/drain electrode.

Mode 2

In this mode, the step of manufacturing the target semiconductive layer using the source semiconductive layer and the step of manufacturing the data line and the source/drain electrode of the thin film transistor are completed at the same time.

The target semiconductive layer and the source/drain electrode are formed at the same time, so as to simplify the manufacturing process. Alternatively, the target semiconductive layer and the source/drain electrode of the thin film transistor are manufactured by a single patterning process through a half masking process.

To be specific, this mode includes:

forming a source/drain electrode film on the source semiconductive layer;

removing the source/drain electrode film outside the predetermined region where the thin film transistor and the data line are to be formed, and removing the source semiconductive layer outside the predetermined region where the thin film transistor and the data line are to be formed; and etching the source/drain electrode film reserved at the predetermined region where the thin film transistor is to be formed, so as to form the source electrode and the drain electrode.

Figure 5:
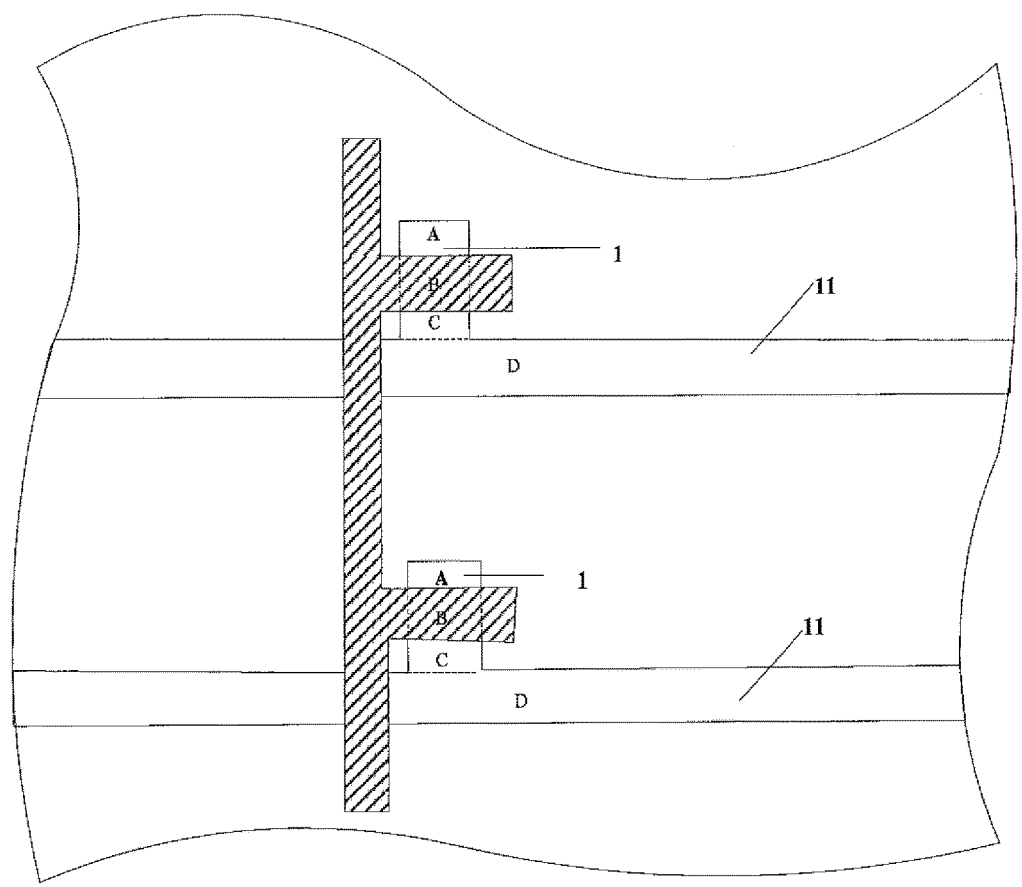
FIG. 5 is another schematic view showing the formation of the target semiconductive film according to one embodiment of the present disclosure.

The half masking process may be used to etch different portions at different thicknesses. As shown in FIG. 5, the source semiconductive film needs to be etched, so as to remove a portion outside region A, region C and region D, in which regions the data lines are to be formed. The source/drain electrode film also needs to be etched, so as to remove the film outside the predetermined region where thin film transistor and the data line are to be formed.

The source/drain electrode film reserved at the predetermined region where the thin film transistor is to be formed, i.e., the source/drain electrode film at the region B, is etched, so as to form the channel region between the source electrode and the drain electrode. Certainly, if the semiconductive film for manufacturing the active layer consists of the intrinsic semiconductive film and the doped semiconductive film, it is further required to etch off the doped semiconductive layer corresponding to the channel region.

According to this mode, the target semiconductive layer and the source/drain electrode of the thin film transistor are manufactured by a single patterning process through the half masking process. As compared with Mode 1, it is able to further reduce the cost of the array substrate while achieving the object of the present disclosure.

Based on the process of manufacturing the array substrate, the whole procedure for manufacturing the array substrate will be described hereinafter.

Step A: manufacturing a common electrode on the substrate. To be specific, the common electrode may be formed on a glass substrate through a known masking process.

Step B: forming the gate line, the gate electrode and the gate insulating layer which covers the gate line and the gate electrode on the first surface of the substrate. The gate line and the gate electrode may be formed by any known techniques which may be achieved by a single patterning process. For example, a gate metal film on the substrate may be patterned by means of a conventional mask, so as to form a pattern including the gate electrode and the gate line. To be specific, the gate meal film is deposited on the substrate, and then exposed, developed and etched with the conventional mask, so as to obtain the pattern including the gate electrode and the gate line. In addition, prior to coating the semiconductive film for manufacturing the active layer, it is further required to form a gate insulating layer covering the gate line and the gate electrode. The gate insulating layer may be formed by a chemical vapor deposition method or any other methods known to those skilled in the art, which are particularly defined herein.

Step C: forming the active layer and the source/drain electrode. It includes the following steps.

Step C1: forming the semiconductive film on the gate insulating layer. The semiconductive film may be formed by a chemical vapor deposition method or any other methods known to a person skilled in the art.

Step C2: patterning the semiconductive film using the gate electrode and the gate line as a mask, so as to form the source semiconductive layer at a region where the gate line and the gate electrode are located, which specifically includes:

forming a positive photoresist film on the substrate provided with the semiconductive film;

exposing the positive photoresist film from a second surface opposite to the first surface of the substrate;

developing the exposed positive photoresist film, and removing the exposed film outside the region where the gate line and the gate electrode are located, so as to expose the semiconductive film outside the region where the gate line and the gate electrode are located; and removing the exposed semiconductive film outside the region where the gate line and the gate electrode are located, so as to obtain the source semiconductive layer.

Step C3: manufacturing a target semiconductive layer using the source semiconductive layer, which specifically includes:

forming a positive photoresist film on the source semiconductive layer;

exposing the positive photoresist film;

developing the exposed positive photoresist film, and removing the exposed positive photoresist film outside a predetermined region where a thin film transistor and a data line are to be formed, so as to expose the source semiconductive layer outside the predetermined region where the thin film transistor and the data line are to be formed; and removing the exposed source semiconductive layer outside the predetermined region where the thin film transistor and the data line are to be formed, so as to obtain the target semiconductive layer.

Step C4: forming the source/drain electrode. To be specific, a metal film for manufacturing the source/drain electrode is coated onto the target semiconductive layer, a photoresist is coated onto the metal film and then exposed and developed with a double-tone mask so as to remove the photoresist at a region where the channel region between the source electrode and the drain electrode is to be formed, and the metal film at the channel region is then etched so as to form the source electrode and the drain electrode. If the semiconductive film for manufacturing the active layer consists of the intrinsic semiconductive film and the doped semiconductive film, it is further required to etch off the doped semiconductive layer at the channel region.

Certainly, in order to simplify the manufacturing process, Steps C3 and C4 may be combined and completed at the same time by a single patterning process in this embodiment, which specifically includes:

forming the source/drain electrode film on the source semiconductive layer;

removing the source/drain electrode film outside the predetermined region where the thin film transistor and the data line are to be formed, and removing the source semiconductive layer outside the predetermined region where the thin film transistor and the data line are to be formed; and etching the source/drain electrode film reserved at the predetermined region where the thin film transistor is to be formed, so as to form the source electrode and the drain electrode.

The half masking process may be used to etch different portions at different thicknesses. For the region outside the predetermined region where the thin film transistor and the data line are to be formed, an etching thickness needs to ensure that the source/drain electrode film and the source semiconductive layer can be etched off simultaneously, while for the predetermine region where the thin film transistor is to be formed, the etching thickness only needs to ensure that the source/drain electrode film can be etched off so as to form the channel region between the source electrode and the drain electrode. Certainly, if the semiconductive film for manufacturing the active layer consists of the intrinsic semiconductive film and the doped semiconductive film, the etching thickness needs to further ensure that the doped semiconductive layer at the channel region can be etched off so as to form the target semiconductive layer.

Step D: forming a pixel electrode via hole. To be specific, an insulating layer is formed on the substrate obtained after Step C by a chemical vapor deposition method or any other methods known to those skilled in the art. A photoresist is coated onto the insulating layer and then exposed and developed with a double-tone mask, so as to remove the photoresist at a region where the pixel electrode via hole is to be formed, thereby to form the pixel electrode via hole.

Step E: forming the pixel electrode. To be specific, a pixel electrode film (e.g., an ITO film) is formed on the insulating layer and in the pixel electrode via hole, and then patterned with a conventional mask, so as to form a pattern including the pixel electrode film. The pixel electrode film may be formed by sputtering, or any other methods known to those skilled in the art. After a photoresist layer coated onto the ITO film is exposed and developed with the conventional mask, the pixel electrode film to be reserved is covered with the photoresist, while the photoresist on the pixel electrode film not desired to be reserved is removed. The undesired ITO film is etched by an etching process, and the remaining pixel electrode film is just the desired, patterned pixel electrode film.

According to the present disclosure, the gate electrode and the gate line are used as the mask so as to pattern the semiconductive film for manufacturing the active layer. The source semiconductive layer at the region where the gate line and the gate electrode are located is formed, and then the target semiconductive layer is manufactured using the source semiconductive film so as to only cover the predetermined region where the thin film transistor and the data line are to be formed. As a result, it is able to avoid the misalignment of the active layer caused when the mask cannot be aligned exactly during the manufacture of the active layer. In addition, it is able to directly use the gate line and the gate electrode as the opaque portion of the mask by means of the opaque feature of the gate electrode and the gate line, thereby to reduce the cost desired for a mask process during the manufacturing of the array substrate. Further, it is able to avoid a leakage current generated when a part of the light from a backlight source is irradiated on the active layer due to the misalignment of the active layer, thereby to avoid the inhomogeneous luminance of the display manufactured using the array substrate.

The present disclosure further provides an array substrate manufactured by the above-mentioned method.

The present disclosure further provides a display device including the above-mentioned array substrate.

The above are merely the preferred embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. A method for manufacturing an array substrate, comprising the steps of:
    forming a gate line, a gate electrode and a gate insulating layer which covers the gate line and the gate electrode on a first surface of a base substrate;
    forming a semiconductive film on the gate insulating layer;
    patterning the semiconductive film using the gate electrode and the gate line as a mask, so as to form a source semiconductive layer, wherein a projection of a pattern of the source semiconductive layer onto the base substrate is within a region of a projection of the gate electrode and the gate line onto the base substrate; and
    manufacturing a target semiconductive layer using the source semiconductive layer;
    wherein the patterning the semiconductive film using the gate electrode and the gate line as a mask so as to form a source semiconductive layer comprises:
        forming a positive photoresist film on the base substrate provided with the semiconductive film;
        exposing the positive photoresist film from a second surface opposite to the first surface of the base substrate;
        developing the exposed positive photoresist film, and removing the exposed film outside the region where the gate line and the gate electrode are located, so as to expose the semiconductive film outside the region where the gate line and the gate electrode are located; and
        removing the exposed semiconductive film outside the region where the gate line and the gate electrode are located, so as to obtain the source semiconductive layer.

2. The method according to claim 1, wherein the step of manufacturing the target semiconductive layer using the source semiconductive layer is completed by a single patterning process prior to forming a source/drain electrode film.

3. The method according to claim 2, wherein the step of manufacturing the target semiconductive layer using the source semiconductive layer comprises:
    forming a positive photoresist film on the source semiconductive layer;
    exposing the positive photoresist film;
    developing the exposed positive photoresist film, and removing the exposed positive photoresist film outside a predetermined region where a thin film transistor and a data line are to be formed, so as to expose the source semiconductive layer outside the predetermined region where the thin film transistor and the data line are to be formed; and
    removing the exposed source semiconductive layer outside the predetermined region where the thin film transistor and the data line are to be formed, so as to obtain the target semiconductive layer.

4. The method according to claim 1, wherein the step of manufacturing the target semiconductive layer using the source semiconductive layer comprises:
    forming a positive photoresist film on the source semiconductive layer;
    exposing the positive photoresist film;
    developing the exposed positive photoresist film, and removing the exposed positive photoresist film outside a predetermined region where a thin film transistor and a data line are to be formed, so as to expose the source semiconductive layer outside the predetermined region where the thin film transistor and the data line are to be formed; and
    removing the exposed source semiconductive layer outside the predetermined region where the thin film transistor and the data line are to be formed, so as to obtain the target semiconductive layer.

5. The method according to claim 4, wherein the step of manufacturing the target semiconductive layer using the source semiconductive layer is completed at the same time with a step of manufacturing the data line and a source/drain electrode of the thin film transistor.

6. The method according to claim 5, wherein the target semiconductive layer and the source/drain electrode of the thin film transistor are manufactured by a single patterning process through a half masking process.

7. The method according to claim 6, wherein the step of manufacturing the target semiconductive layer using the source semiconductive layer comprises:
    forming a source/drain electrode film on the source semiconductive layer;
    removing the source/drain electrode film outside the predetermined region where the thin film transistor and the data line are to be formed, and removing the source semiconductive layer outside the predetermined region where the thin film transistor and the data line are to be formed; and etching the source/drain electrode film reserved at the predetermined region where the thin film transistor is to be formed, so as to form a source electrode and a drain electrode.

8. The method according to claim 1, wherein the gate insulating layer is formed by a chemical vapor deposition method.

9. The method according to claim 1, wherein the semiconductive film is formed on the gate insulating layer by a chemical vapor deposition method.

10. An array substrate manufactured by the method according to claim 1.

11. An array substrate manufactured by the method according to claim 2.

12. An array substrate manufactured by the method according to claim 3.

13. An array substrate manufactured by the method according to claim 4.

14. An array substrate manufactured by the method according to claim 5.

15. A display device, comprising the array substrate according to claim 2.

\* \* \* \* \*